United States Patent
Chern et al.

(10) Patent No.: US 8,816,732 B2
(45) Date of Patent: Aug. 26, 2014

(54) CAPACTIVE LOAD PLL WITH CALIBRATION LOOP

(75) Inventors: Chan-Hong Chern, Palo Alto, CA (US); Tao Wen Chung, San Jose, CA (US); Ming-Chieh Huang, San Jose, CA (US); Chih-Chang Lin, San Jose, CA (US); Tsung-Ching Huang, San Jose, CA (US); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 13/530,136

(22) Filed: Jun. 22, 2012

(65) Prior Publication Data

US 2013/0342247 A1 Dec. 26, 2013

(51) Int. Cl.
*H03L 7/06* (2006.01)
(52) U.S. Cl.
USPC .............................. 327/157; 375/373; 331/16
(58) Field of Classification Search
USPC .............................. 327/157; 375/373; 331/16
See application file for complete search history.

(56) References Cited

U.S. PATENT DOCUMENTS

| | | | | |
|---|---|---|---|---|
| 5,828,258 A | * | 10/1998 | Ooishi et al. | 327/291 |
| 6,452,430 B1 | * | 9/2002 | Tung et al. | 327/156 |
| 6,492,862 B2 | * | 12/2002 | Nakahara | 327/536 |
| 6,794,916 B1 | * | 9/2004 | Varma | 327/218 |
| 6,952,124 B2 | * | 10/2005 | Pham | 327/156 |
| 7,330,081 B1 | * | 2/2008 | Asa et al. | 331/57 |
| 7,471,158 B2 | * | 12/2008 | Han et al. | 331/17 |
| 7,590,387 B2 | * | 9/2009 | Chien | 455/67.11 |
| 8,154,350 B2 | * | 4/2012 | Faison | 331/16 |
| 2005/0226357 A1 | * | 10/2005 | Yoshimura | 375/376 |
| 2006/0211393 A1 | * | 9/2006 | Chien | 455/265 |
| 2007/0057736 A1 | * | 3/2007 | Baird et al. | 331/16 |
| 2013/0082754 A1 | * | 4/2013 | Chern et al. | 327/157 |

* cited by examiner

*Primary Examiner* — Ryan Jager
(74) *Attorney, Agent, or Firm* — Duane Morris LLP; Jarred Gunther

(57) ABSTRACT

A circuit includes a capacitive-load voltage controlled oscillator having an input configured to receive a first input signal and an output configured to output an oscillating output signal. A calibration circuit is coupled to the voltage controlled oscillator and is configured to output one or more control signals to the capacitive-load voltage controlled oscillator for adjusting a frequency of the oscillating output signal. The calibration circuit is configured to output the one or more control signals in response to a comparison of an input voltage to at least one reference voltage.

9 Claims, 11 Drawing Sheets

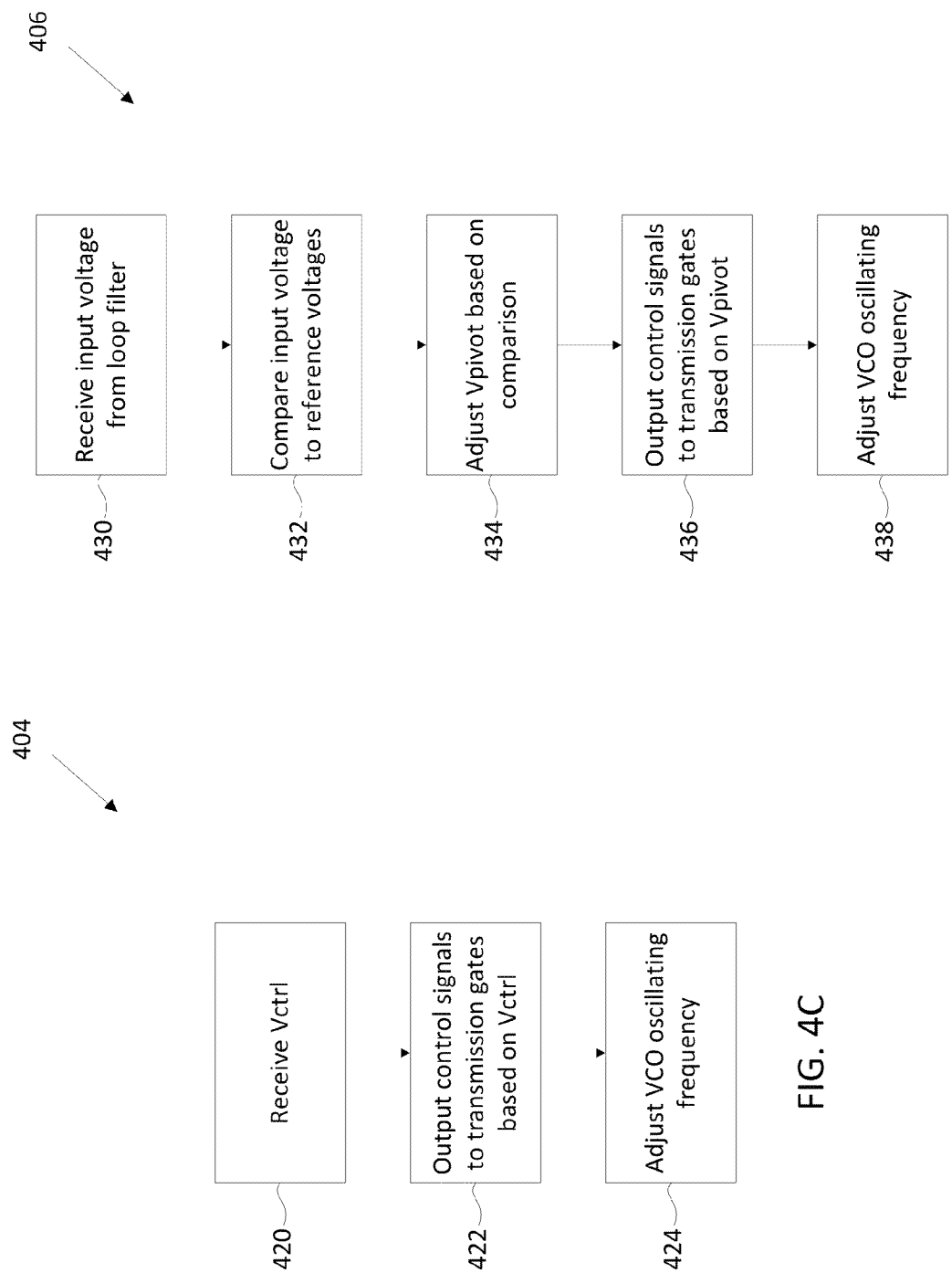

CAPACITIVE LOAD PLL WITH CALIBRATION LOOP

FIELD OF DISCLOSURE

The disclosed system and method relate to integrated circuits. More particularly, the disclosed system and method relate to integrated circuits including phase-locked loop circuits.

BACKGROUND

Phase-locked loop ("PLL") circuits are control systems that generate output signals having a phase that is related to an input signal or reference signal. PLL circuits are widely used in communications systems such as telecommunications, radio, computer, and other data communication systems.

It is desirable to have PLLs that operate correctly over a wide range of frequencies. However, wide operating frequency ranges for a small range of voltage controlled oscillator ("VCO") operating ranges in advanced processing technologies translate in high VCO gains ("Kvco"), which results in greater noise from the input or reference clock. Additionally, high Kvco requires large loop filter capacitors, which increases the overall circuit size, or requires a low-charge pump current, which is more sensitive to charge pump current mismatch, in order to achieve a fixed PLL bandwidth range.

BRIEF DESCRIPTION OF THE DRAWINGS

FIG. 4C is a flow diagram of one example of a method of a fine tuning operation of a voltage controlled oscillator in accordance with some embodiments.

FIG. 4D is a flow diagram of one example of a method of a coarse tuning operation of a voltage controlled oscillator in accordance with some embodiments.

DETAILED DESCRIPTION

This description of the exemplary embodiments is intended to be read in connection with the accompanying drawings, which are to be considered part of the entire written description.

Figure 1:
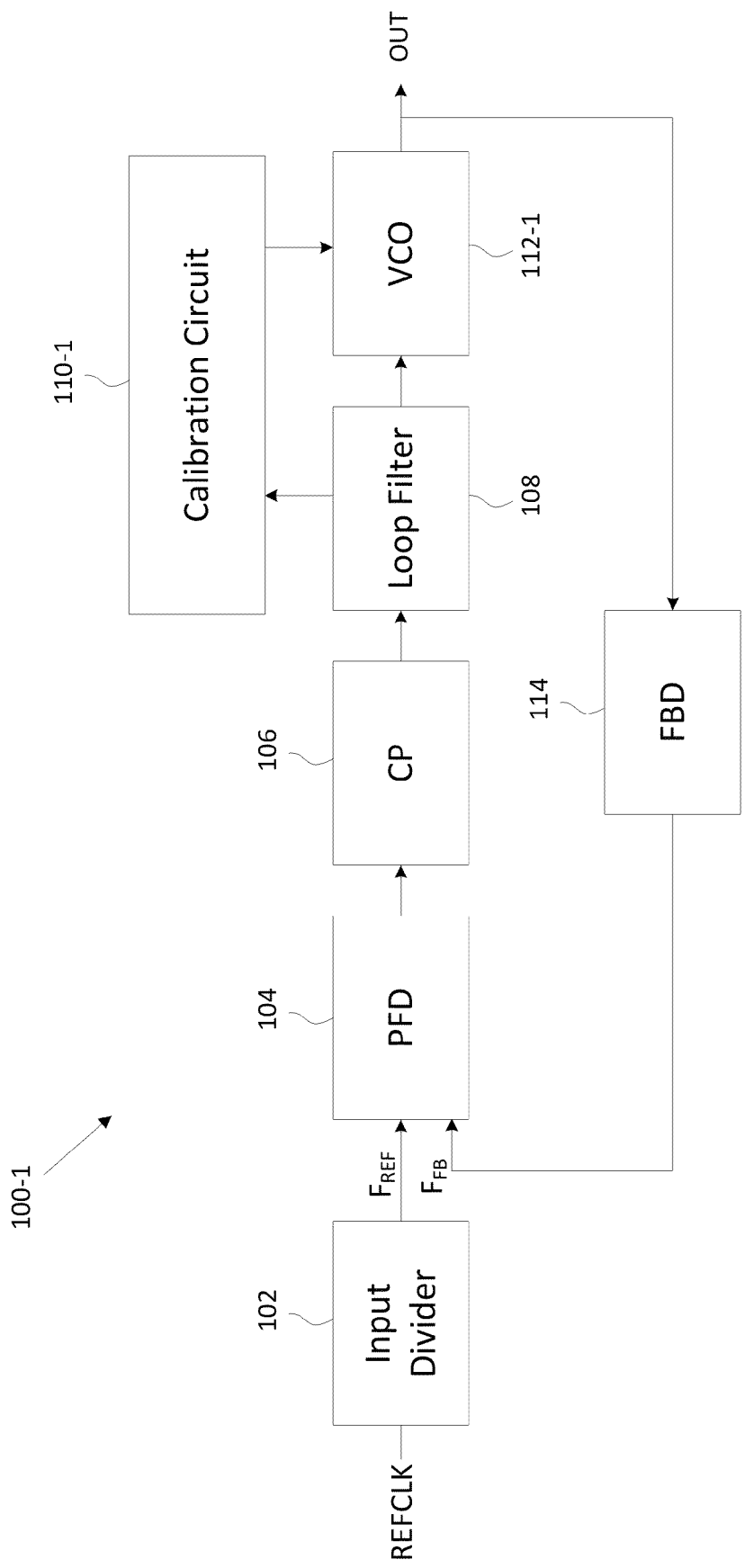
FIG. 1 is a block diagram of one example of a phase-locked loop in accordance with some embodiments.

FIG. 1 illustrates one example of a phase-locked loop ("PLL") 100-1 in accordance with some embodiments. PLL 100-1 includes an input divider block 102 that receives a reference clock, REFCLK, and outputs a reference frequency, $F_{REF}$, to a phase-frequency detector ("PFD") 104. PFD 104 is coupled to a charge pump ("CP") 106, which has its output coupled to a loop filter 108. Loop filter 108 is coupled to an analog capacitive load calibration circuit 110-1 and to a capacitive load voltage controlled oscillator ("VCO") 112-1. VCO 112-1 has its output coupled to a feedback divider circuit ("FBD") 114, which may be implemented as a divide by N circuit and provides a feedback frequency signal, $F_{FB}$, to PFD 104.

Figure 2:
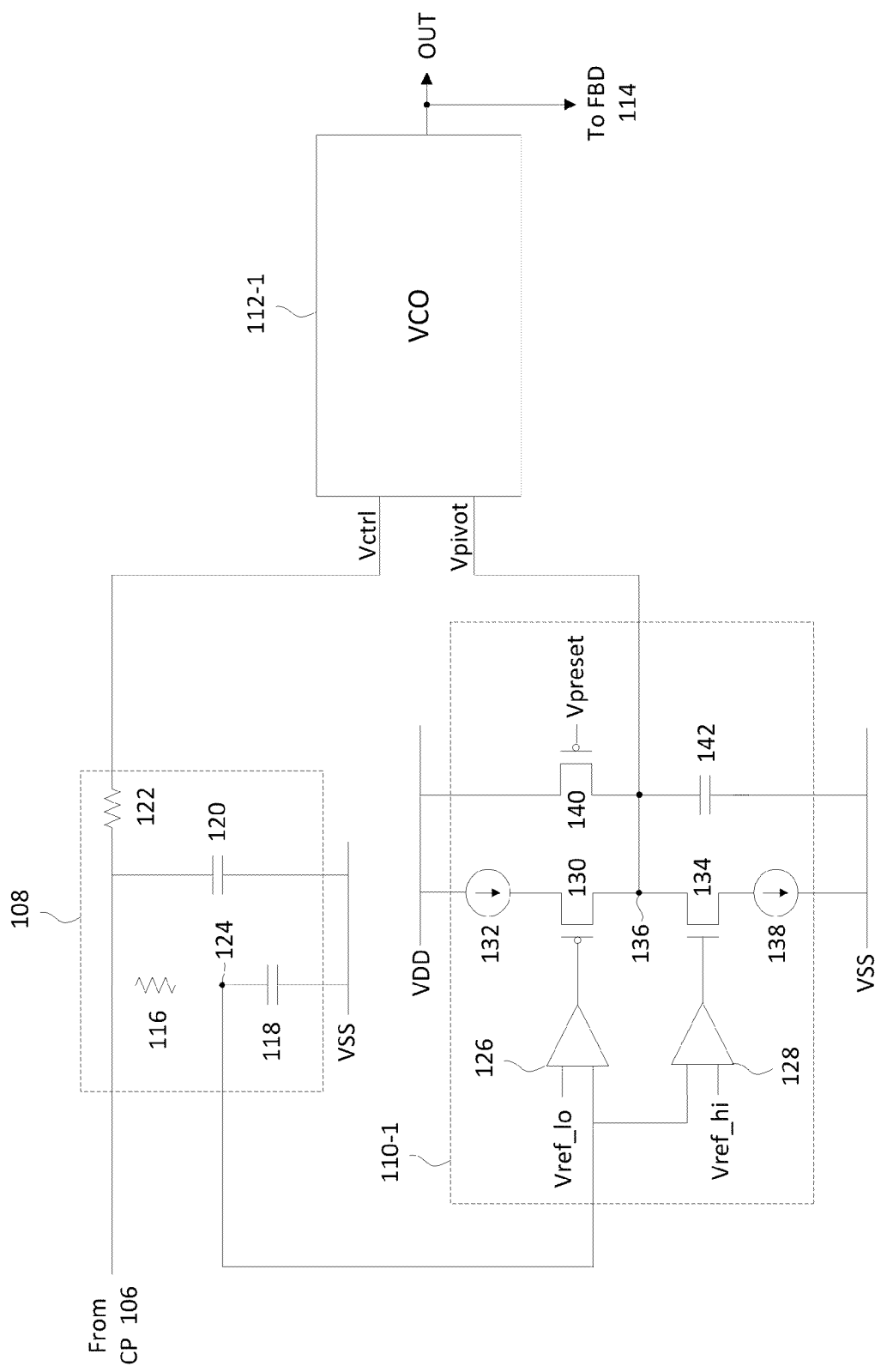
FIG. 2 is a schematic of one example of a loop filter and calibration circuit in accordance with the phase-locked loop illustrated in FIG. 1.

Turning now to FIG. 2, loop filter 108 includes a resistor 116 coupled in series with a capacitor 118, which is coupled to ground or low voltage supply VSS. Resistor 116 and capacitor 118 are coupled in parallel with capacitor 120 and resistor 122, which is disposed in parallel with capacitor 120. Resistor 122 is coupled to an input of VCO 112-1, which receives control voltage, Vctrl, from loop filter 108. Resistor 122 is optional and used to provide one extra order of loop filtering.

Node 124 is disposed between resistor 116 and capacitor 118 of loop filter 108 and is coupled to a first input, which may be a non-inverting input, of operation amplifiers ("opamp") 126 and 128 of one embodiment of a calibration circuit 110-1. A second input of opamp 126, which is the inverting input, is coupled to receive a low reference voltage, Vref_lo, and a second input of opamp 128 receives a high reference voltage, Vref_hi.

The output of opamp 126 is coupled to the gate of transistor 130, which has its source coupled to a high voltage supply VDD through a current source 132. In some embodiments, transistor 130 is a PMOS transistor. The drain of transistor 130 is coupled to the drain of transistor 134 via node 136. In some embodiments, transistor 134 has its source coupled to ground or low voltage supply VSS through a current source 138 and its gate coupled to the output of opamp 128. Node 136 serves as the output of calibration circuit 110-1, which provides pivot voltage, Vpivot, to VCO 112-1. Node 136 is also coupled to the drain of a transistor 140 and to capacitor 142. Transistor 140 has its source coupled to high voltage source VDD and has its gate coupled to a preset voltage, Vpreset.

Figure 3:
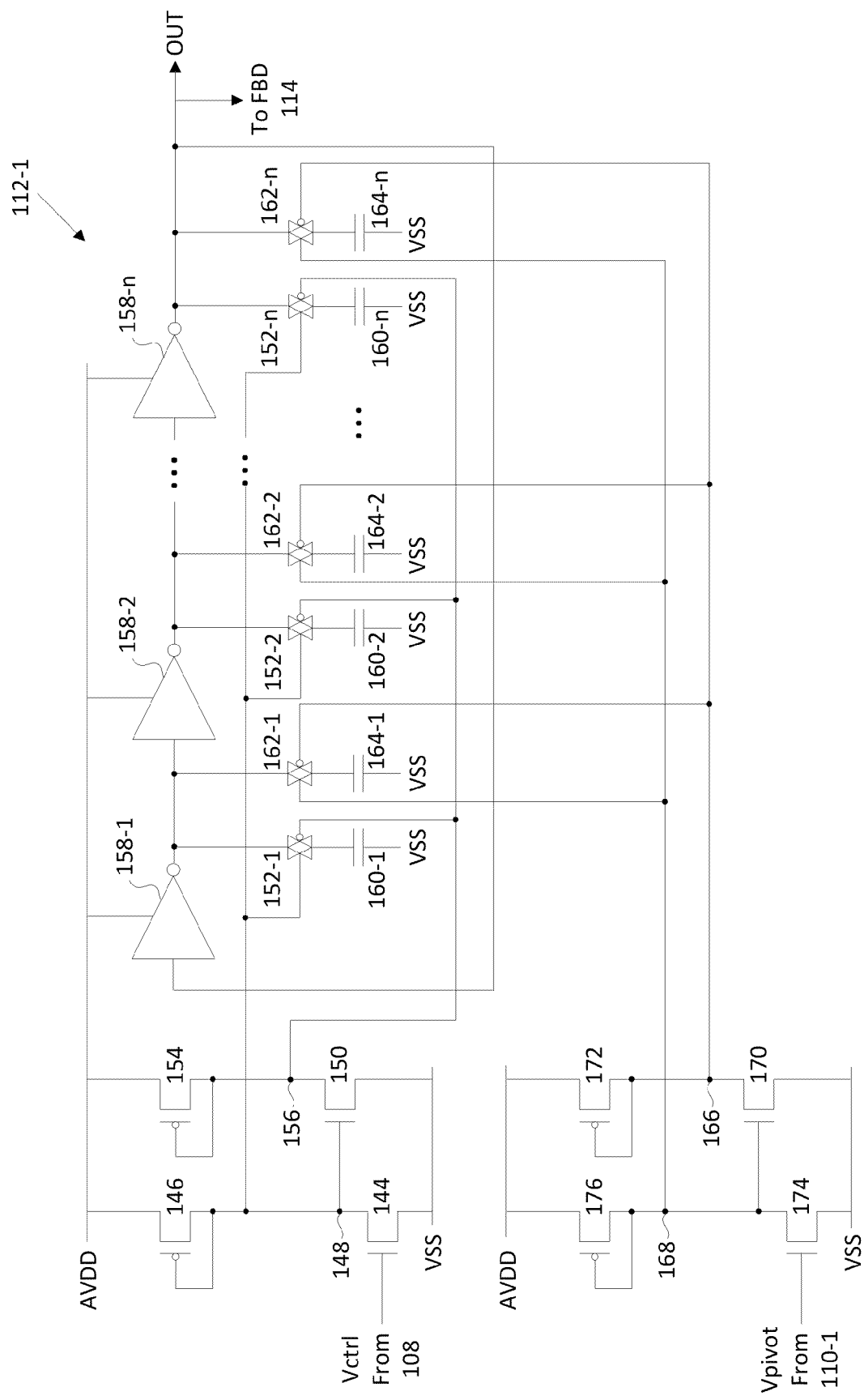
FIG. 3 is a schematic of one example of a voltage controlled oscillator in accordance with the phase-locked loop illustrated in FIG. 1.

One embodiment of a VCO 112-1 is illustrated in FIG. 3. As shown in FIG. 3, VCO 112-1 receives the control voltage, Vctrl, output from loop filter 108 at the gate of a transistor 144. Transistor 144 has its source coupled to ground or a low voltage supply VSS and its drain coupled to the gate and drain of transistor 146 at node 148. The source of transistor 146 is coupled to a high analog voltage supply AVDD.

Node 148 is coupled to the gate of transistor 150 and to transmission gates 152-1, 152-2, ..., and 152-n (collectively "transmission gates 152"). In some embodiments, transmission gates 152 are replaced by a switch, which may be implemented as a transistor as will be understood by one of ordinary skill in the art. Transistor 150 has its source coupled to ground or low voltage supply VSS and its drain coupled to transistor 154 at node 156. Node 156 is also coupled to another input or terminal of transmission gates 152. Each transmission gate 152 is coupled to an output of a respective inverter 158-1, 158-2, ..., and 158-n (collectively "inverters 158"), which are arranged in series with each other to form a ring, and to a respective capacitor 160-1, 160-2, ..., and 160-n (collectively "capacitors 160"). Capacitors 160 are coupled to ground or to a low voltage supply VSS.

The output of each of the inverters 158 is coupled to a second respective transmission gate 162-1, 162-2, ..., and 162-n (collectively "transmission gates 162"). In some embodiments, transmission gates 162 are replaced by a switch, which may be implemented as a transistor as will be understood by one of ordinary skill in the art. Each of the transmission gates 162 is coupled to a respective capacitor 164-1, 164-2, ..., and 164-n (collectively "capacitors 164"). Capacitors 164 are coupled to ground or to a low voltage supply VSS. In some embodiments, capacitors 164 are each of an equal nominal size that is larger than a nominal size of capacitors 160. Transmission gates 162 turn on harder, less harder, or off in response to signals received from signals received from nodes 166 and 168.

Node 166 is coupled to the drain of transistor 170 and to the gate and drain of transistor 172, which has its source coupled to AVDD. Transistor 170 has its source coupled to ground or to a low voltage supply VSS and its gate coupled to node 168. Node 168 is coupled to the drain of transistor 174 and the gate and drain of transistor 176, which has its source coupled to AVDD. Transistor 174 has its source coupled to ground or to low voltage supply VSS and its gate coupled to the output of calibration circuit 110, i.e., node 136 of analog calibration circuit 110-1.

The operation of calibration circuit 110-1 and voltage controlled oscillator 112-1 is described with reference to FIGS. 4A-4D. Referring first to FIG. 4A, an example of a frequency versus voltage graph of a VCO 112-1 is illustrated. As shown in FIG. 4A, the pivot voltage, Vpivot, has an approximately linear slope, which corresponds to Kvco, between 0.4 volts and 0.9 volts as does control voltage, Vctrl. The high and low voltages, Vref_hi and Vref_lo, are selected based on the tuning curve illustrated in FIG. 4A. For example, Vref_hi is set at 0.9 volts, and Vref_lo is set at 0.4 volts.

Figure 4B:
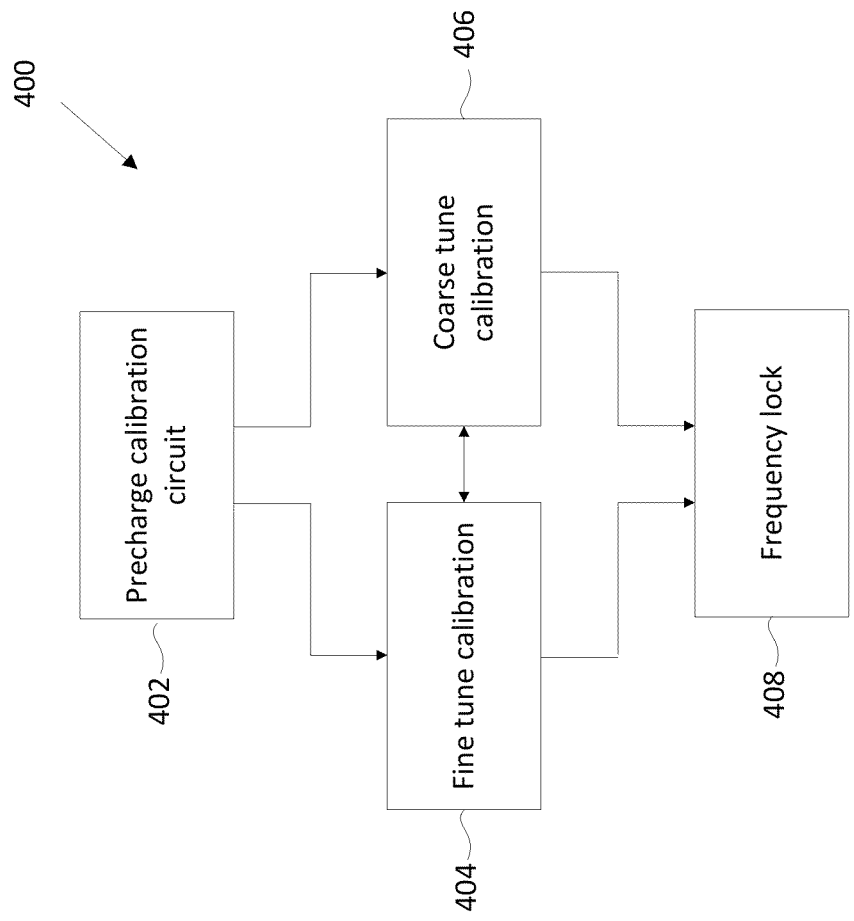
FIG. 4B is a flow diagram of one example of a method of tuning a voltage controlled oscillator in accordance with some embodiments.
Figure 4A:
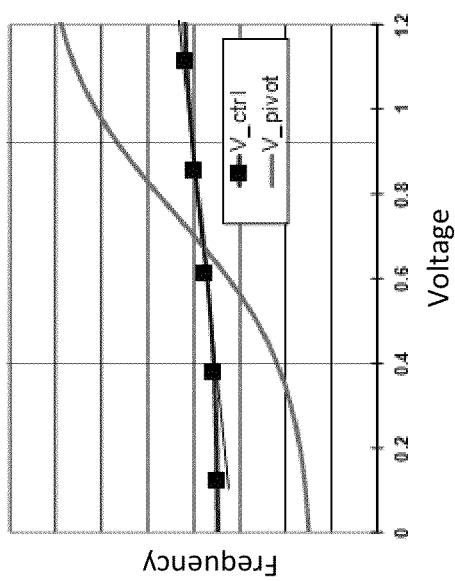
FIG. 4A is one example of a tuning curve of the voltage controlled oscillator illustrated in FIG. 3 in accordance with some embodiments.

Turning now to FIG. 4B, calibration circuit 110-1 is precharged at block 402. As best seen in FIG. 2, the preset voltage, Vpreset, which is coupled to the gate of transistor 140 turns on transistor 140 a certain amount of time such that capacitor 142 is pre-charged to a certain voltage, which is selected as the initial Vpivot voltage. Vpivot is selected to be between the high and low reference voltages, Vref_hi and Vref_lo, as illustrated in FIG. 4A. Voltages at nodes 166 and 168 in response to the magnitude of Vpivot are provided to transmission gates 162 such that capacitors 164 are coupled to the outputs of the respective inverters 158 causing VCO 112-1 to oscillate at a first frequency.

As will be understood by one of ordinary skill in the art, silicon and process variations may cause Vpivot to have a voltage that differs from the nominal voltage it was designed to be. Consequently, VCO 112-1 will perform differently than it was designed, i.e., VCO 112-1 may oscillate at a different frequency than the frequency at which it was designed to oscillate.

At block 404, VCO 112-1 performs a fine-tuning adjustment. Fine-tune adjustment block 404 is described with reference to FIG. 4C. As shown in FIG. 4C, fine-tune adjustment includes receiving the control voltage, Vctrl, from loop filter 108 at block 420. As best seen in FIG. 3, Vctrl is received at the gate of transistor 144.

At block 422, control signals are generated and output to transmission gates 152 in response to Vctrl. For example, if the voltage of Vctrl is above a threshold voltage of transistor 144, $V_{th144}$, then transistor 144 turns into a current-conducting "on" state. As will be understood by one of ordinary skill in the art, the greater the Vctrl is above $V_{th144}$ the faster and more node 148 is pulled to VSS, and the smaller Vctrl is above $V_{th144}$ the slower and less node 148 is pulled to VSS. With node 148 at VSS, transistor 150, which has its gate coupled to node 148, is in a non-current-conducting "off" state causing node 156 to rise towards AVDD.

At block 424, the voltages at nodes 148 and 156 form the control signals that are output to transmission gates 152 to adjust the oscillating frequency of VCO 112-1. The degree to which transmission gates 152 are turned on is based on the voltage of the control signals, i.e., $V_{148}$ and $V_{156}$. For example, the closer the potential of $V_{148}$ is to the potential of AVDD and $V_{156}$ is to the potential of VSS then the more transmission gates 152 are turned on. The closer the potential of $V_{148}$ is to the potential of VSS and the potential of $V_{156}$ is to AVDD, then the more transmission gates 152 are turned off.

When transmission gates 152 are fully on, then the outputs of inverters 158 will see a highly-capacitive load as capacitors 160 are coupled to the outputs of inverters 158. A capacitive load at the output of inverters 158 causes the VCO to oscillate slower. In contrast, when transmission gates 152 are fully off, then the outputs of inverters 158 see a highly-resistive path to capacitors such that capacitors 160 are essentially decoupled from the outputs of inverters 158 (leaving aside transmission gates 162, which are discussed in greater detail below) such that VCO oscillates faster.

Referring again to FIGS. 4A and 4B, the fine-tune adjustment at block 404 (FIG. 4A) adjusts the frequency of VCO 112-1 in response to control voltage, Vctrl, in accordance with the tuning graph illustrated in FIG. 4A. As shown in FIG. 4A, the slope of the Vctrl line is smaller than the slope of the line of Vpivot, which corresponds to Vctrl providing fine tuning.

If Vctrl moves between the two reference voltages, which in the example illustrated in FIG. 4A are 0.4 volts and 0.9 volts, and does not result in PLL 100-1 locking onto the reference frequency, Fref, then method 400 moves to block 406 for coarse tuning. If the fine tuning at block 404 results in a frequency lock at 408, then method 400 ends.

The coarse tuning at block 406 is described with reference to FIG. 4D. At block 430, an input voltage is received at calibration circuit 110-1 from loop filter 108. As illustrated in FIG. 2, calibration circuit 110-1 receives the input voltage from node 124 of loop filter 108. The input voltage is received at a respective input of opamps 126 and 128.

At block 432, the input voltage received from filter 108 is compared to reference voltages. As shown in FIG. 2, for example, opamps 126, 128 receive the input voltage from loop filter 108 and respectively compare the voltage received from loop filter 108 to Vref_lo and to Vref_hi. Although Vref_lo is described as being equal to 0.4 volts and Vref_hi is described as being equal to 0.9 volts, one of ordinary skill in the art will understand that the values of Vref_lo and Vref_hi may be higher or lower than these values.

At block 434, the pivot voltage, Vpivot, is adjusted based on the comparison of the input voltage to the reference voltages. For example and referring again to FIG. 2, if the input voltage is less than Vref_lo, opamp 126 outputs a low voltage (e.g., less than or equal to zero volts) to the gate of transistor 130, which results in transistor 130 turning on. The input voltage being less than Vref_lo means that it is also less than Vref_hi resulting in opamp 128 outputting a low voltage to the gate of transistor 134. A low voltage at the gate of transistor 134 turns off transistor 134. With transistor 130 on and transistor 134 off, the voltage at node 136 is increased as current source 132 provides additional charge to node 136 thereby increasing the potential of Vpivot.

If the input voltage is greater than Vref_hi, which means it is also greater than Vref_lo, opamp 128 outputs a high voltage to the gate of transistor 134 such that transistor 134 is turned on. Op amp 126 outputs a high voltage to the gate of transistor 130, which turns off transistor 130. With transistor 134 on and transistor 130 off, current source 138 discharges node 136 thereby reducing the potential of Vpivot.

If the input voltage is greater than Vref_lo and less than Vref_hi, the voltages output from opamps 126 and 128 to the gates of respective transistors 130 and 134 will turn off transistors 130 and 134. With transistors 130 and 134 off, Vpivot is maintained at its precharge or previous state.

At block 436, control signals are output to transmission gates based on Vpivot. As illustrated in FIG. 3, Vpivot is received at the gate of transistor 174. If Vpivot is above the threshold voltage of transistor 174, $V_{th174}$, then transistor 174 is turned on such that the voltage at node 168 is pulled lower as current flows to VSS from node 168. As the voltage at node 168 decreases, transistor 170, which has its gate coupled to node 168, turns off causing node 166 to rise towards AVDD. The voltages at nodes 168 and 166 serve as the control signals for turning on and off of transmission gates 162.

At block 438, the oscillating frequency of VCO 112-1 is adjusted in response to the control signals. The degree to which transmission gates 162 are turned on depends on the voltage of the control signals, i.e., the voltage at node 168, $V_{168}$, and at node 166, $V_{166}$. For example, the greater the potential is of $V_{168}$ in combination with a lower potential of $V_{166}$ results in transmission gates 162 being turned more on, and the lower the potential is of $V_{168}$ in combination with a greater potential of $V_{166}$ results in transmission gates being turned more off.

Transmission gates 162 being fully on couples each of capacitors 164 to the respective outputs of inverters 158. A capacitive load at the output of inverters 158 increases a delay in which the output of each inverter 158 changes state, which slows down the oscillating frequency of VCO 112-1. In some embodiments in which capacitors 164 have a greater capacitance than capacitors 160, coupling capacitors 164 to the outputs of inverter 158 causes a greater change in the oscillating frequency of VCO 112-1, i.e., a coarse tuning adjustment, compared to coupling capacitors 160 to the outputs of inverters 158, which are used as a fine tuning adjustment as described above.

Transmission gates 162 being fully off effectively decouples capacitors 164 from the outputs of inverters 158. With capacitors 164 decoupled from the outputs of inverters 158, the output load of inverters 158 is a resistive output load resulting in VCO 112-1 oscillating at a higher frequency than when inverters 158 have a capacitive load.

Referring again to FIG. 4B, the order in which coarse tuning is performed at block 406 and fine tuning is performed at block 406 may be varied. For example, coarse tuning block 406 may be performed before, during, or after fine tuning at block 404. Once PLL 100-1 has locked onto the frequency at block 408, the tuning operations at blocks 404 and 406 may cease until further tuning is necessary, i.e., when PLL 100-1 for some reason is no longer locked onto the reference signal, REFCLK.

Figure 5:
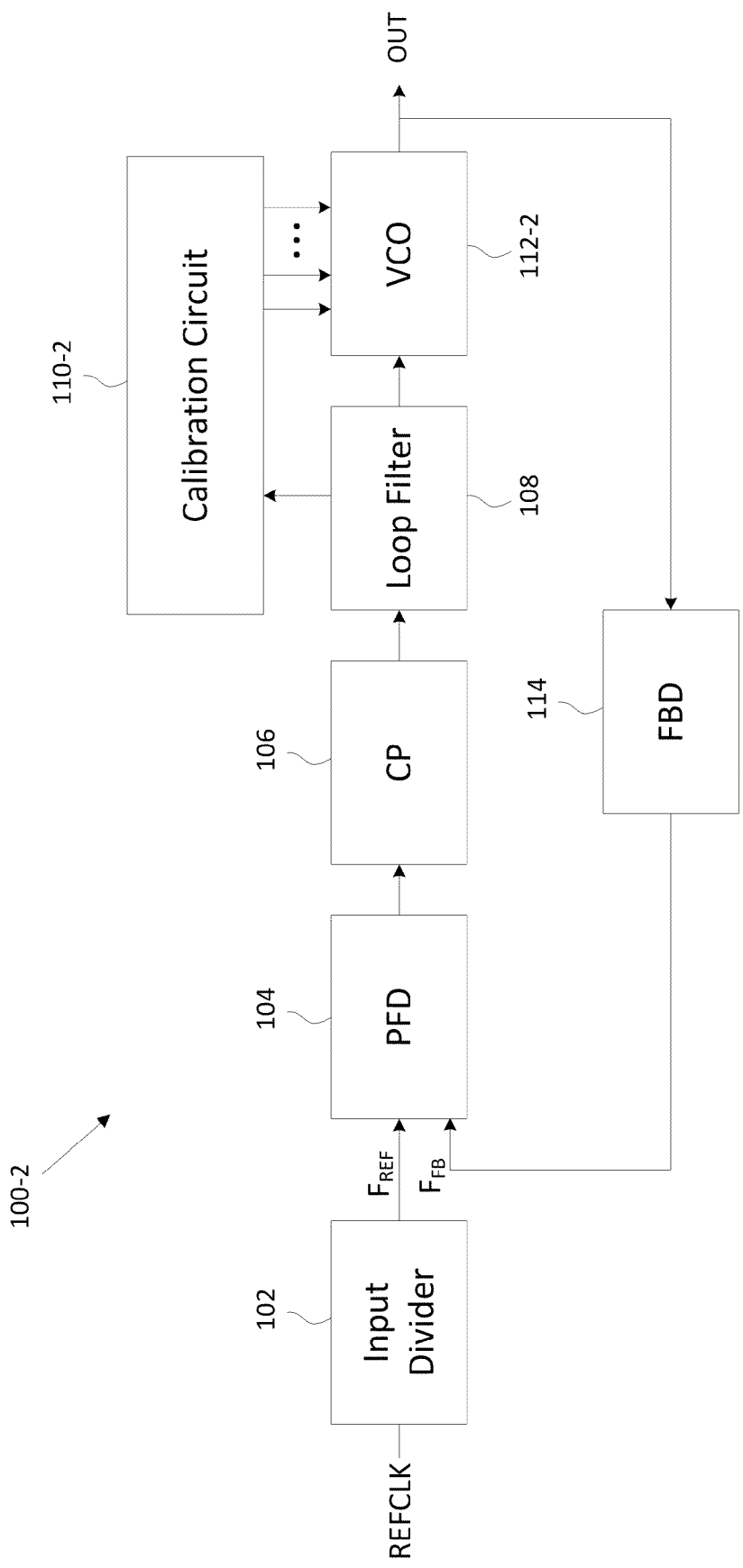
FIG. 5 is a block diagram of another example of a phase-locked loop in accordance with some embodiments.

PLLs including digital calibration circuits for VCOs are also possible. FIG. 5 illustrates one example of such a PLL circuit 100-2. PLL 100-2 includes an input divider block 102 that receives a reference clock, REFCLK, and outputs a reference frequency, $F_{REF}$, to PFD 104. PFD 104 is coupled to CP 106, which has its output coupled to a loop filter 108. Loop filter 108 is coupled to a digital capacitive load calibration circuit 110-2 and to a capacitive load VCO 112-2. VCO 112-2 has its output coupled to FBD 114, which may be implemented as a divide by N circuit that provides feedback frequency signal, $F_{FB}$, to PFD 104.

Figure 6:
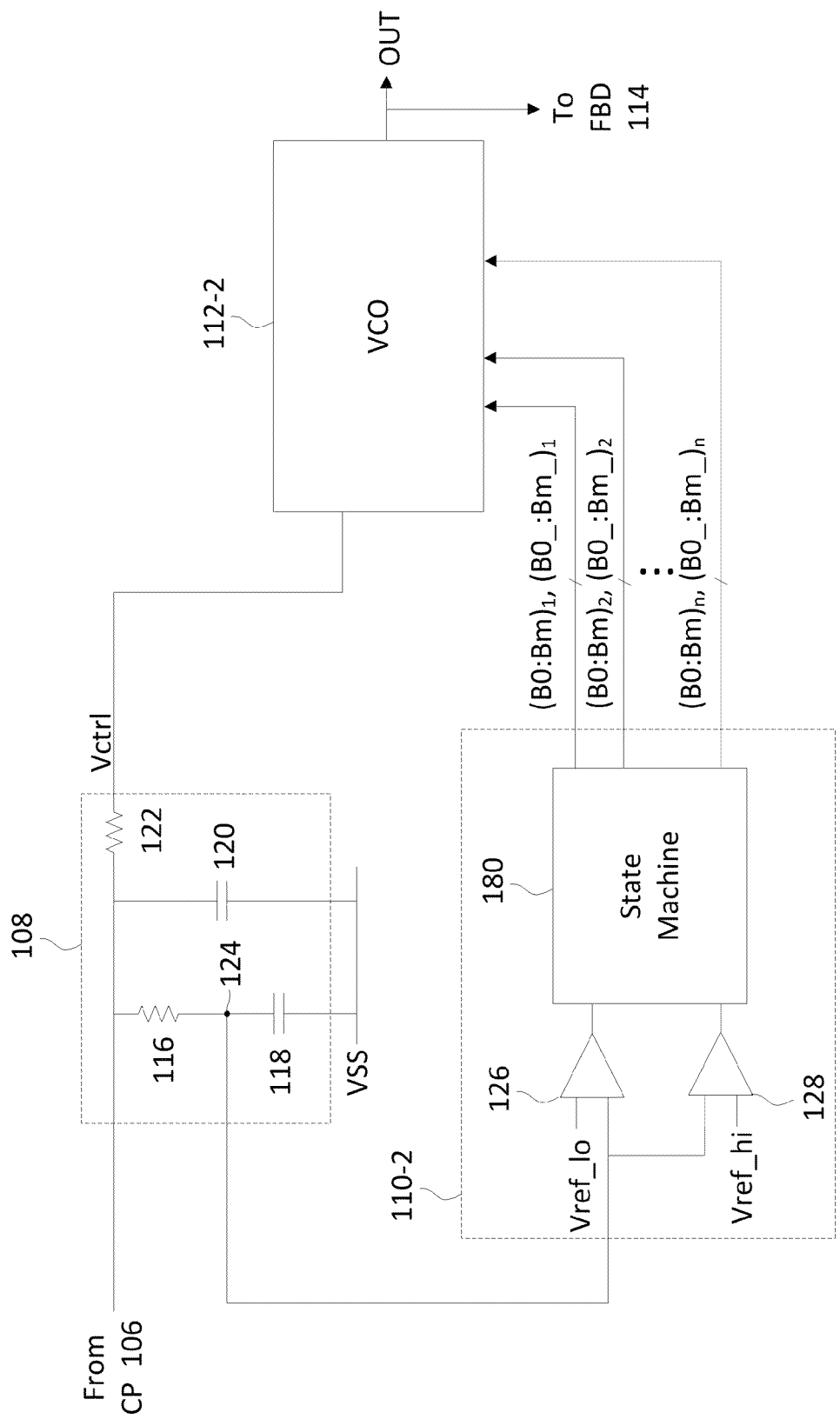
FIG. 6 is a schematic of one example of a loop filter and calibration circuit in accordance with the phase-locked loop illustrated in FIG. 5.

FIG. 6 illustrates one example of the connections between loop filter 108 and digital calibration circuit 110-2. As shown in FIG. 6, loop filter 108 includes a resistor 116 coupled in series with a capacitor 118, which is coupled to ground or to low voltage supply VSS. Resistor 116 and capacitor 118 are coupled in parallel with capacitor 120 and resistor 122, which is disposed in parallel with capacitor 120. Resistor 122 is coupled to an input of VCO 112-2, which receives control voltage, Vctrl, from loop filter 108. As mentioned above, resistor 122 can be optional and provided for an extra order of loop filtering.

Node 124 is disposed between resistor 116 and capacitor 118 of loop filter 108 and is coupled to a first input, which may be a non-inverting input, of operation amplifiers ("opamp") 126 and 128 of one embodiment of a digital calibration circuit 110-2. A second input of opamp 126, which is the inverting input, is coupled to receive a low reference voltage, Vref_lo, and a second input of opamp 128 receives a high reference voltage, Vref_hi.

The outputs of opamps 126 and 128 are coupled to a state machine 180. State machine 180 generates n sets of complementary multi-bit bit signals ($B0_1$:$Bm_1$-$B0_n$:$Bm_n$ and $B0\_\_1$:$Bm\_\_1$-$B0\_\_n$:$Bm\_\_n$) based on the outputs of opamps 126 and 128. As shown in FIG. 6, n sets of signals having m bits are output to VCO 112-2 from state machine 180.

Figure 7A:
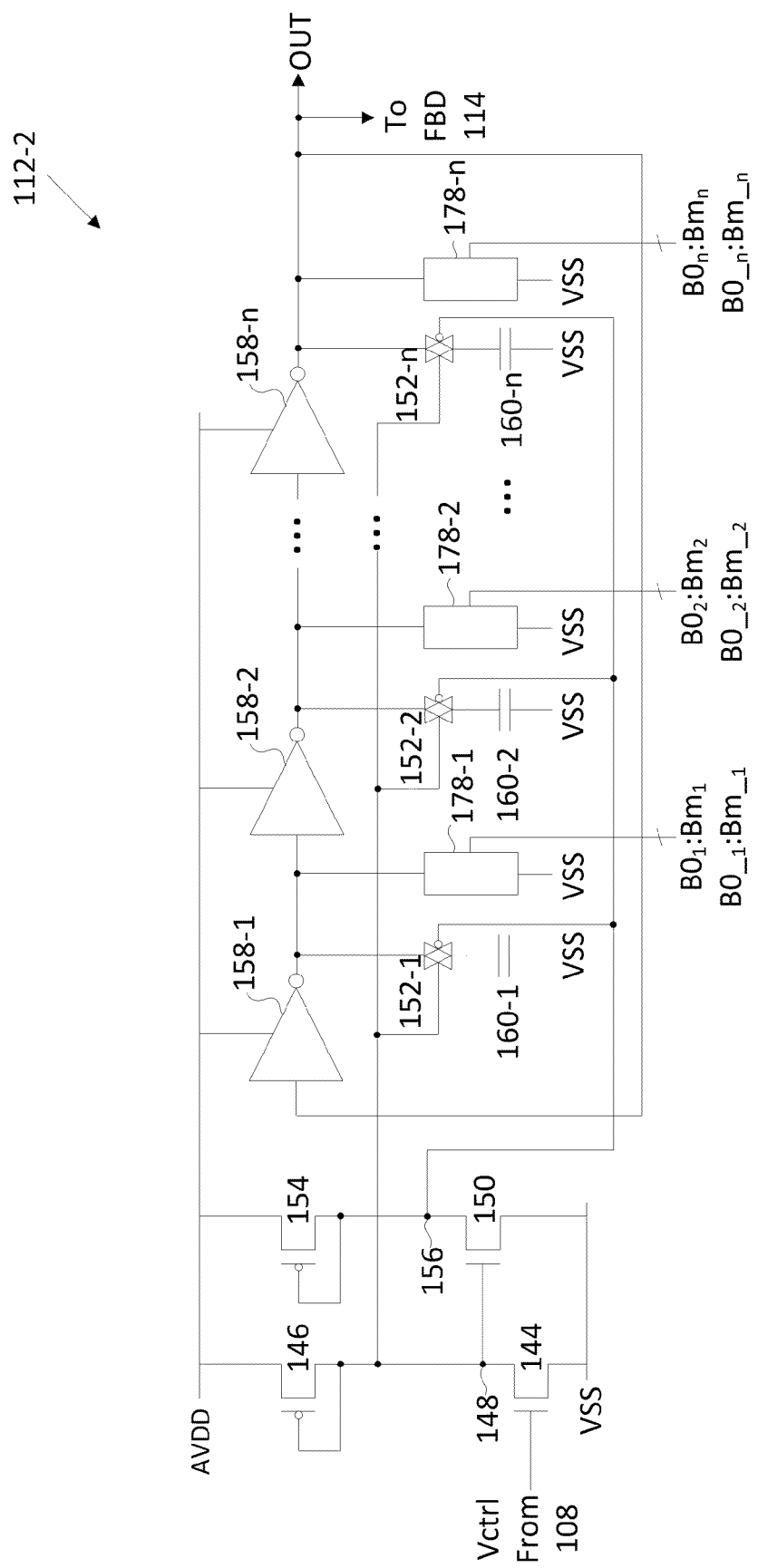
FIGS. 7A and 7B are schematics of one example of a voltage controlled oscillator in accordance with some embodiments.

Turning now to FIG. 7A, VCO 112-2 receives Vctrl, which is output from loop filter 108, at the gate of transistor 144. Transistor 144 has its source coupled to ground or a low voltage supply VSS and its drain coupled to the gate and drain of transistor 146 at node 148. The source of transistor 146 is coupled to a high analog voltage supply AVDD.

Node 148 is coupled to the gate of transistor 150 and to transmission gates 152. In some embodiments, transmission gates 152 are replaced by a switch, which may be implemented as a transistor as will be understood by one of ordinary skill in the art. Transistor 150 has its source coupled to ground or low voltage supply VSS and its drain coupled to transistor 154 at node 156. Node 156 is also coupled to another input or terminal of transmission gates 152. Each transmission gate 152 is coupled to an output of a respective inverter 158, which are coupled to each other to form a ring, and to a respective capacitor 160. Capacitors 160 are coupled to ground or to a low voltage supply VSS.

Figure 7B:
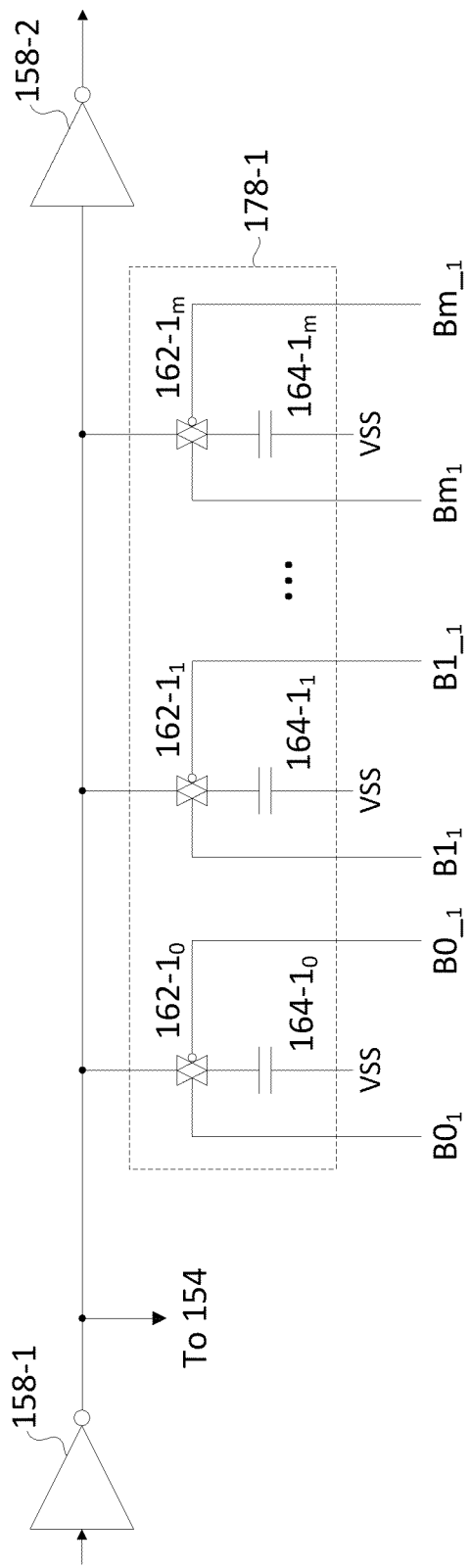

The output of each of the inverters 158 is coupled to a respective capacitor array 178-1, 178-2, . . . , 178-n (collectively "capacitive arrays 178"). Capacitive arrays 178 receive the multi-bit signals output from the state machine 180. As shown in FIG. 7B, capacitive array 178-1 is coupled between the output of inverter 158-1 and the input of inverter 158-2 and includes m+1 transmission gates $162\text{-}1_0$, $162\text{-}1_2$, $162\text{-}1_m$ disposed in parallel with one another. In some embodiments, transmission gates 162 are replaced by a switch, which may be implemented as a transistor as will be understood by one of ordinary skill in the art. Each transmission gate $162\text{-}1_0$, $162\text{-}1_2$, $162\text{-}1_m$ is coupled to a respective capacitor $164\text{-}1_0$, $164\text{-}1_2$, $164\text{-}1_m$ and receive a pair of complementary control signals ($B0_1$:$Bm_1$-$B0_n$:$Bm_n$ and $B0\_\_1$:$Bm\_\_1$-$B0\_\_n$:$Bm\_\_n$) from the state machine 180.

For example, transmission gate $162\text{-}1_0$ of capacitive array 178-1 receives complementary control signals $B0_1$ and $B0\_\_1$ from state machine 180. Control signals $B0_1$ and $B0\_\_1$ turn on and off transmission gate $162\text{-}1_0$ for selectively coupling capacitor $164-1_0$ to the output of inverter 158-1. Transmission gate $162-1_1$ is coupled to capacitor $164-1_1$ and receives complementary bit signals $B1_1$ and $B1\_\_1$ from state machine 180. The number of capacitors 164-1 in capacitive array 178-1 may be varied. In some embodiments, each capacitor array 178 includes an equal number of capacitors 164 with each capacitor 164 having an equal nominal capacitance. In some embodiments, capacitor arrays 178 include a different number of capacitors. In some embodiments, capacitors 164 in a capacitor array 178 are binary weighted or vary from one another in their nominal capacitance using another weighting scheme.

Figures 8A, 8B:
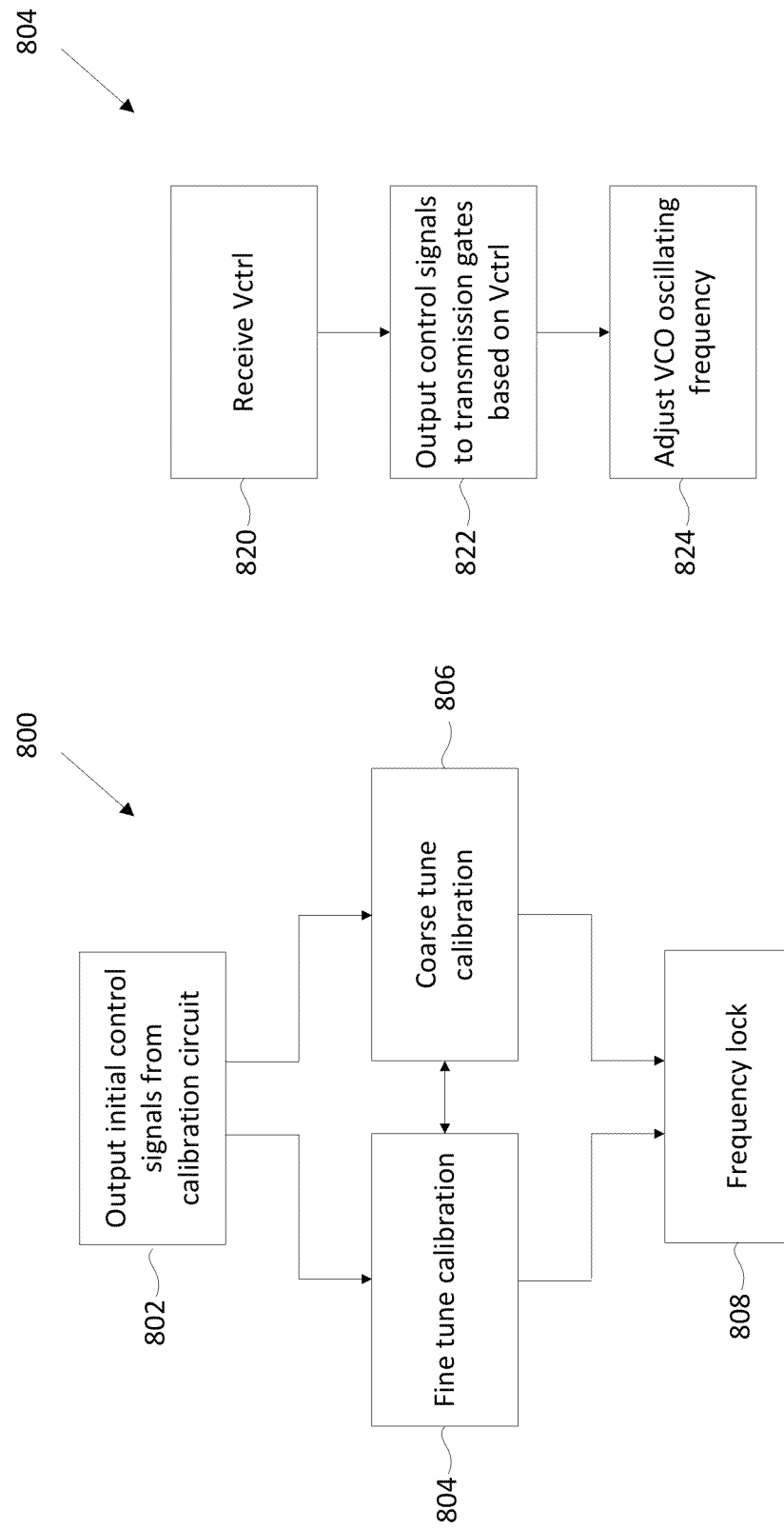
FIG. 8A is a flow diagram of another example of a method of tuning a voltage controlled oscillator in accordance with some embodiments.
FIG. 8B is a flow diagram of another example of a fine tuning operation of a voltage controlled oscillator in accordance with some embodiments.
Figure 8C:
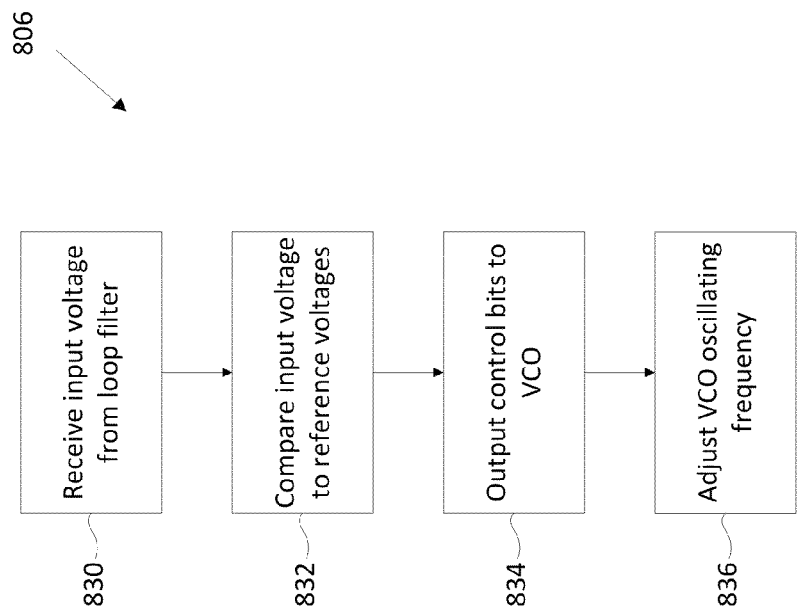
FIG. 8C is a flow diagram of another example of a coarse tuning operation of a voltage controlled oscillator in accordance with some embodiments.

The operation of calibration circuit 110-2 and voltage controlled oscillator 112-2 is described with reference to FIGS. 8A-8C. At block 802, digital calibration circuit 110-2 outputs initial calibration control signals to VCO 112-2. As illustrated in FIG. 6, state machine 180 outputs control signals ($B0_1$: $Bm_1$-$B0_n$:$Bm_n$ and $B0\_\_1$:$Bm\_\_1$-$B0\_\_n$:$Bm\_\_n$) to VCO 112-2. In some embodiments, the controls signals output from state machine 180 cause a number of transmission gates 162 in a capacitive array 178 to be turned on such that a number of capacitors 164 are coupled to the outputs of inverters 158. In some embodiments, the control signals output from state machine 180 are set such that none of transmission gates 162 are on.

At block 804, a fine tuning adjustment is performed on VCO 112-2. FIG. 8B is a flow diagram of one example fine tuning adjustment performed on VCO 112-2. At block 820, VCO 112-1 receives Vctrl from loop filter 108. As illustrated in FIG. 7A, Vctrl is received from loop filter 108 at the gate of transistor 144.

At block 822, control signals are generated and output to transmission gates 152 in response to Vctrl. For example, if the voltage of Vctrl is above $V_{th144}$, then transistor 144 turns on and current flows from node 148 to VSS thereby reducing the voltage at node 148, $V_{148}$. With $V_{148}$ at VSS, transistor 150, which has its gate coupled to node 148, is in an off state causing node 156 to rise towards AVDD via current through transistor 154.

At block 824, the voltages at nodes 148 and 156 form the control signals that are output to transmission gates 152 to adjust the oscillating frequency of VCO 112-2. The degree to which transmission gates 152 are turned on is based on the voltage of the control signals, i.e., $V_{148}$ and V. As described above, the closer the potential of $V_{148}$ is to the potential of AVDD and the closer $V_{156}$ is to the potential of VSS then the more transmission gates 152 are turned on. The closer the potential of $V_{148}$ is to the potential of VSS and the potential of $V_{156}$ is to AVDD, then the more transmission gates 152 are turned off.

When transmission gates 152 are from partially on to fully on, the outputs of inverters 158 will see a capacitive load as capacitors 160 are coupled to the outputs of inverters 158. A capacitive load at the output of inverters 158 causes the VCO to oscillate slower. In contrast, when transmission gates 152 are fully off, then the outputs of inverters 158 is resistive as capacitors 160 are essentially decoupled from the outputs of inverters 158 (leaving aside transmission gates 162, which are discussed in greater detail below) such that VCO oscillates faster.

Referring again to FIG. 8A, if the fine tuning at block 804 results in a frequency lock at 808, then method 800 ends. If PLL 100-2 does not lock, then a coarse tuning operation is performed at block 806. Coarse tuning includes receiving an input voltage from loop filter 108 at block 830 in FIG. 8C. As shown in FIG. 6, digital calibration circuit 110-2 receives the input voltage from node 124 of loop filter 108.

At block 832, the input voltage is compared to reference voltages. In some embodiments, the reference voltages, e.g., Vref_lo and Vref_hi, are selected based on a tuning curve of VCO 112-2. Opamps 126, 128 receive the input voltage from loop filter 108 and respectively compare the voltage received from loop filter 108 to Vref_lo and to Vref_hi.

At block 834, digital control bits are output to VCO 112-2. The digital control bits are output to VCO 112-2 from state machine 180 of calibration circuit 110-2. State machine 180 generates digital control bit signals in response to the voltages output from opamps 126, 128 based on the comparison of the input voltage to reference voltages Vref_lo and Vref_hi. In some embodiments, state machine 180 includes an analog to digital converter ("ADC") that converts the analog voltages output from opamps 126 and 128 to digital voltage levels and a look-up table used by state machine 180 to identify control signals that are to be output in response to the digital voltage levels.

At block 836, the oscillating frequency of VCO 112-2 is adjusted in response to the digital control bits. As described above, the digital control bits output from state machine 180, i.e., $B0_1$:$Bm_1$-$B0_n$:$Bm_n$, and $B0\_\_1$:$Bm\_\_1$-$B0\_\_n$:$Bm\_\_n$, selectively turn on and off transmission gates 164 of capacitive arrays 178 as best seen in FIG. 7B. For example, if complementary control bit pairs $B0_1$ and $B0\_\_1$ are a logic one and a logic zero, respectively, then transmission gate $162-1_0$ is turned on such that capacitor $164-1_0$ is coupled to the output of inverter 158-1. Conversely, if complementary control bit pairs $B0_1$ and $B0\_\_1$ are a logic zero and a logic one, respectively, then transmission gate $162-1_0$ is turned off such that capacitor $164-1_0$ is decoupled from the output of inverter 158-1.

The oscillation frequency of VCO 112-2 is lowered when more capacitors 162 are coupled to the outputs of inverters 158. In some embodiments in which capacitors 164 have a greater capacitance than capacitors 160, coupling capacitors 164 to the outputs of inverter 158 causes a greater change in the oscillating frequency of VCO 112-2, i.e., a coarse tuning adjustment, compared to coupling capacitors 160 to the outputs of inverters 158, which are used as a fine tuning adjustment as described above.

Referring again to FIG. 8A, the order in which coarse tuning is performed at block 806 and fine tuning is performed at block 804 may be varied. For example, coarse tuning block 806 may be performed before, during, or after fine tuning at block 804. Once PLL 100-2 has locked onto the frequency at block 808, the tuning operations at blocks 804 and 806 may cease until further tuning is necessary, i.e., when PLL 100-2 for some reason is no longer locked onto the reference signal, REFCLK.

The disclosed circuits advantageously provide small Kvco over a wide range of operating frequencies. The small Kvco correlates to improved jitter performance of a phase-locked loop. Additionally, the automatic tuning disclosed herein saves production and testing costs. Although only single-ended circuits have been illustrated, one of ordinary skill in the art will understand that the disclosed circuits can be adapted for differential operation.

In some embodiments, a circuit includes a capacitive-load voltage controlled oscillator having an input configured to receive a first input signal and an output configured to output an oscillating output signal. A calibration circuit is coupled to the voltage controlled oscillator and is configured to output one or more control signals to the capacitive-load voltage controlled oscillator for adjusting a frequency of the oscillating output signal. The calibration circuit is configured to output the one or more control signals in response to a comparison of an input voltage to at least one reference voltage.

In some embodiments, a method includes receiving an input signal at a capacitive-load voltage controlled oscillator, performing a first tuning of a frequency at which the capacitive-load voltage controlled oscillator oscillates in response to a voltage of the input signal, and performing a second tuning of the frequency at which the capacitive-load voltage controlled oscillator oscillates in response to an input voltage received at a calibration circuit. The second tuning is based on a comparison of the input voltage to at least one reference voltage. An oscillating signal is output from the capacitive-load voltage controlled oscillator. A frequency of the oscillating signal is based on the frequency at which the capacitive-load voltage controlled oscillator oscillates.

A circuit includes a voltage controlled oscillator and a calibration circuit coupled to the voltage controlled oscillator. The voltage controlled oscillator includes an input configured to receive a first input signal, an output configured to output an oscillating output signal, and a plurality of inverters forming a ring. Each of the plurality of inverters has a respective output coupled to first and second sets of switches. The first set of switches is coupled to a first capacitor, and the second set of switches is coupled to a capacitive circuit. The calibration circuit is configured to output one or more control signals to the respective second set of switches of the voltage controlled oscillator for adjusting a frequency of the oscillating output signal. The one or more control signals are output in response to a comparison of an input voltage to at least one reference voltage.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A circuit, comprising:
   a capacitive-load voltage controlled oscillator having a first input configured to receive a first input signal, a second input configured to receive one or more control signals, and an output configured to output an oscillating output signal; and
   a calibration circuit including:
      a first comparator having a first input for receiving a second input signal, a second input for receiving a first reference voltage, and an output coupled to a gate of a first transistor; and
      a second comparator having a first input for receiving the second input signal, a second input for receiving a second reference voltage, and an output coupled to a gate of a second transistor that is coupled to the first transistor at a node,
   wherein the first and second comparators of the calibration circuit are configured to output respective output signals to the gates of the first and second transistors for varying a voltage at the node to generate the one or more control signals for adjusting a frequency of the oscillating output signal, and
   wherein the capacitive-load voltage controlled oscillator includes a plurality of inverters coupled in series with one another, each of the plurality of inverters having a respective output coupled to at least two capacitors disposed in parallel with one another and coupled to the output of the inverters through respective switches.

2. The circuit of claim 1, wherein each switch receives at least one control signal generated in response to the voltage at the node of the calibration circuit.

3. The circuit of claim 1, wherein the calibration circuit includes
   a capacitor coupled between a first power supply and the node at which the first and second transistors are coupled, and
   a third transistor having a source coupled to a second power supply, a drain coupled to the node at which the first and second transistors are coupled, and a gate configured to receive a signal for selectively turning on the third transistor for charging the capacitor to a precharge voltage.

4. A circuit, comprising:
   a voltage controlled oscillator including
      an input configured to receive a first input signal,
      an output configured to output an oscillating output signal, and
      a plurality of inverters forming a ring, each of the plurality of inverters having a respective output coupled to first and second sets of switches, the first set of switches coupled to a first capacitor, and the second set of switches coupled to a capacitive circuit; and
   a calibration circuit coupled to the voltage controlled oscillator, the calibration circuit including:
      a first comparator having a first input for receiving a second input signal, a second input for receiving a first reference voltage, and an output coupled to a gate of a first transistor; and
      a second comparator having a first input for receiving the second input signal, a second input for receiving a second reference voltage, and an output coupled to a gate of a second transistor that is coupled to the gate of the first transistor at a node,
   wherein the calibration circuit is configured to output one or more control signals to the respective second set of switches of the voltage controlled oscillator for adjusting a frequency of the oscillating output signal, wherein the one or more control signals are generated based on a voltage at the node that is adjusted based on signals output by the first and second comparators.

5. The circuit of claim 4, wherein each of the first switches receives at least one signal having a voltage based on the first signal for selectively coupling the respective first capacitor to the output of the respective inverter.

6. The circuit of claim 4, wherein the calibration circuit includes
   a capacitor coupled between a first power supply and the node at which the first and second transistors are coupled, and
   a third transistor having a source coupled to a second power supply, a drain coupled to the node at which the first and second transistors are coupled, and a gate configured to receive a signal for selectively turning on the third transistor for charging the capacitor to a precharge voltage.

7. The circuit of claim 4, wherein the respective first and second switches are transmission gates.

8. A circuit, comprising:
   a capacitive-load voltage controlled oscillator having a first input configured to receive a first input signal, a second input configured to receive one or more control signals, and an output configured to output an oscillating output signal; and
   a calibration circuit including:

a first comparator having a first input for receiving a second input signal, a second input for receiving a first reference voltage, and an output coupled to a gate of a first transistor;

a second comparator having a first input for receiving the second input signal, a second input for receiving a second reference voltage, and an output coupled to a gate of a second transistor that is coupled to the first transistor at a node, a capacitor coupled between a first power supply and the node at which the first and second transistors are coupled, and a third transistor having a source coupled to a second power supply, a drain coupled to the node at which the first and second transistors are coupled, and a gate configured to receive a signal for selectively turning on the third transistor for charging the capacitor to a precharge voltage, wherein the first and second comparators of the calibration circuit are configured to output respective output signals to the gates of the first and second transistors for varying a voltage at the node to generate the one or more control signals for adjusting a frequency of the oscillating output signal.

9. The circuit of claim 8, wherein the capacitive-load voltage controlled oscillator includes a plurality of inverters coupled in series with one another, each of the plurality of inverters having a respective output coupled to at least two capacitors disposed in parallel with one another and coupled to the output of the inverters through respective switches.

* * * * *